United States Patent [19]
Wu

[11] Patent Number: 6,008,774
[45] Date of Patent: Dec. 28, 1999

[54] PRINTED ANTENNA STRUCTURE FOR WIRELESS DATA COMMUNICATIONS

[75] Inventor: Chen Wu, Hamilton, Canada

[73] Assignee: Celestica International Inc., North York, Canada

[21] Appl. No.: 09/040,334

[22] Filed: Mar. 18, 1998

[30] Foreign Application Priority Data

Mar. 21, 1997 [CA] Canada .................................. 2200675

[51] Int. Cl.⁶ .................................................. H01Q 9/30
[52] U.S. Cl. ................................. 343/828; 343/700 MS; 343/702
[58] Field of Search ..................................... 343/828, 831, 343/863, 700 MS, 702, 795, 809

[56] References Cited

U.S. PATENT DOCUMENTS

| | | | |
|---|---|---|---|
| 4,001,834 | 1/1977 | Smith | 343/754 |
| 4,816,839 | 3/1989 | Landt | 343/795 |
| 4,960,983 | 10/1990 | Inoue | 235/449 |
| 5,212,373 | 5/1993 | Fujioka et al. | 235/492 |
| 5,233,360 | 8/1993 | Kuroda et al. | 343/700 MS |
| 5,268,699 | 12/1993 | Laute et al. | 343/702 |
| 5,321,240 | 6/1994 | Takahira | 235/380 |
| 5,337,063 | 8/1994 | Takahira | 343/741 |
| 5,428,214 | 6/1995 | Hakkers et al. | 235/492 |
| 5,451,971 | 9/1995 | Grossman et al. | 343/828 |
| 5,484,997 | 1/1996 | Haynes | 235/492 |
| 5,606,732 | 2/1997 | Vignone | 343/702 |
| 5,657,028 | 8/1997 | Sanad | 343/700 MS |
| 5,828,340 | 10/1998 | Johnson | 343/700 MS |
| 5,838,285 | 11/1998 | Tay et al. | 343/700 MS |

FOREIGN PATENT DOCUMENTS

2138384 C2  10/1982  Germany .................................. 343/795

OTHER PUBLICATIONS

Bailey, M.C. and Croswell, W.F., Chapter 18—"Antennas", in *Electronic Engineers Handbook*, 3rd Ed., McGraw–Hill, © 1989, pp. 18–2→18–23 and 18–40→18.47.

*Primary Examiner*—Don Wong
*Assistant Examiner*—Tan Ho
*Attorney, Agent, or Firm*—Blake, Cassels & Graydon; Alex Porat

[57] ABSTRACT

A printed antenna structure for transmission of radio frequency energy in the gigahertz range that provides good dispersion characteristics and a relatively wide bandwidth using a thin substrate material. The antenna includes a thin printed circuit board having top and bottom surfaces. The bottom surface features an electrically conductive ground plane layer. The top surface features a microstrip feed line structure which is connected to a radiating element. The microstrip feedline extends over the ground plane but the radiating element does not. The radiating element has a main V-shaped segment for coupling radio energy over a wide spatial region, and a tuning stub is sequentially connected to the V-shaped segment. Overall, the printed antenna has an overall shape which resembles a hook in oder to minimize the space occupied on the printed circuit board.

16 Claims, 6 Drawing Sheets

Fig. 7A
EΦ in X-Y plane

Fig. 7B
Eθ in X-Y plane

Fig. 7C
EΦ in X-Z plane

Fig. 7D
Eθ in X-Z plane

Fig. 7E
EΦ in Y-Z plane

Fig. 7F
Eθ in Y-Z plane

Fig. 8

PRINTED ANTENNA STRUCTURE FOR WIRELESS DATA COMMUNICATIONS

FIELD OF INVENTION

The invention relates generally to the field of antennas and more particularly to printed antennas, namely antennas composed of thin layers of electrically conductive material bonded onto a thin, planar, dielectric material.

BACKGROUND OF THE INVENTION

With the advent of mobile "lap top" computers, there has been an increased demand to link such devices in a wireless local area network. Likewise, there has been a marked increase in the use of wireless devices such as miniature cordless phones and pagers. A general problem in the design of laptops and other types of small, portable, wireless data communication products lies in the type of radiating structure required for the unit, which should be convenient and reliable. When an external dipole or monopole structure is used, such an antenna can be readily broken in normal use. Also, the cost of the external antenna and its associated conductors add considerably to the cost of the final product.

In an effort to avoid use of an external antenna, some manufacturers have used conventional microstrip patch antennas, the characteristics of which are well known. Basically, a microstrip patch antenna comprises a dielectric material, such as a printed circuit board, which has two opposed surfaces. One of the surfaces is coated with an electrically conductive layer which functions as a ground plane, and the other opposed surface has an essentially rectangularly or circularly shaped electrically conductive layer ("microstrip patch") disposed so as to extend over the ground plane. This structure provides the main radiating element of the microstrip patch antenna. In the rectangular patch antenna, the rectangular patch has a length equal to substantially one-half the wavelength of the resonant frequency, also called the resonant wavelength. In the circular patch antenna, the circular patch has a diameter of about 0.6 of the resonant wavelength. Either type of microstrip patch antenna presents a thin resonating cavity wherein a standing electromagnetic wave can exist in the patch and wherein radiation emanates from the edges thereof.

Microstrip patch antennas, however, have many limitations. One limitation is that the microstrip patch antenna can only typically radiate above the ground plane, which is a necessary element of the device. The need for a ground plane also causes the resonant frequency of the antenna to depend on the dielectric constant of the printed circuit board, which can vary considerably due to manufacturing variances. Thus it is difficult to mass produce tuned devices of this kind. Moreover, because the microstrip patch antenna is a highly resonant thin cavity structure, the bandwidth of such an antenna is greatly dependent upon the thickness of the dielectric material. Thus, very thin printed circuit boards, which are increasingly found in portable wireless communications devices, tend to limit the available bandwidth provided with such antennas. Finally, the length of the microstrip patch antenna is relatively large due to the necessity of having an overall length of about one-half the wavelength of the resonant frequency or about 0.6 of such wavelength in the case of a circular microstrip patch antenna. There are methods known in the art for increasing the bandwidth and reducing the size of the microstrip patch antenna, but such method are relatively complicated and generally not conducive to mass produced devices.

The present invention seeks to overcome the limitations of prior art printed antenna structures and allow for more robust radiating characteristics while being more tolerant of manufacturing variances typically encountered in mass produced printed circuit boards. It also desired for the printed antenna to occupy relatively little area on the printed circuit board or other dielectric material.

SUMMARY OF THE INVENTION

According to one broad aspect of the invention, a printed antenna is provided for transmission of a spectrum of electromagnetic waves having a center wavelength $\lambda_o$. The printed antenna comprises a thin dielectric material having opposed surfaces. A strip of electrically conductive material covers a portion of one of the surfaces of the dielectric material so as to provide a radiating element. The strip of electrically conductive material, however, does not substantially extend over any large regions of electrically conductive material, such as a ground plane, disposed on the opposed surface of the dielectric material. The strip of electrically conductive material has an overall length of approximately $\lambda_o/2$, and includes a first segment and a sequential second segment which collectively compose a main radiating element. The first and second segments are generally linear in shape and disposed so as to be angled with respect to one another. A transmission means, attached to the dielectric material, is provided for coupling radio frequency energy between the radiating element of the antenna and antenna driving circuitry.

In the preferred embodiment of this aspect of the invention according to this first broad aspect thereof, the main radiating element substantially assumes a "V"-shape wherein the linear segments thereof are orthogonal to one another. The overall shape of the radiating element (which comprises the main radiating element and the remaining portions of the strip of electrically conductive material) resembles a hook composed of a sequentially connected series of substantially linear segments.

According to another broad aspect of the invention, a printed antenna structure is provided which includes a dielectric material having opposed surfaces. A first layer of electrically conductive material covers a relatively wide portion of one the surfaces of the dielectric material in order to provide a ground plane. A first strip of electrically conductive material covers a portion of the opposite surface of the dielectric material and is disposed so as to extend over the electrically conductive ground plane layer, so as to provide a microstrip feed line. A second strip of electrically conductive material provides a main radiating element for the antenna. It is electrically connected to the first strip of conductive material, covering a portion of one of the surfaces of the dielectric material and being disposed thereon so as to not substantially extend over the electrically conductive ground plane layer. The main radiating element includes sequential first and second segments which are generally linear and disposed so as to be angled with respect to one another.

In the preferred embodiment of this second broad aspect of the invention, the printed antenna structure includes a third strip of electrically conductive material which provides a secondary radiating element. The third strip has a fixed end continuous with the second strip of electrically conductive material and a free terminal end that does not connect with the second strip of electrically conductive material. The third strip is also disposed so as not to substantially extend over the ground plane layer, and this strip includes third and fourth sequential, generally linear segments which are angled with respect to one another. In the preferred embodiment, the third and fourth segments are arranged so as to give the printed antenna structure an overall shape which resembles a hook.

As described in greater detail below, the printed antenna of the invention presents an omnidirectional radiation pattern having good coupling characteristics over a wide spatial region. The antenna thus provides good performance in a multi-path environment, where the probability of the angle of incidence of the electric field of an incoming electromagnetic wave is substantially equal from any region of space. Such multi-path environments are common in many wireless data communication applications.

In addition, as described in greater detail below, as the radiating elements are not disposed over a ground plane, the frequency response and bandwidth of the printed antenna of the invention is relatively immune to variations in the dielectric constant and thickness of the dielectric material or the printed circuit board which functions as the substrate thereof. Moreover, the printed antenna of the invention need only occupy a relative small surface area. These characteristics of the printed antenna are conducive for manufacturing the antenna by means of high volume production techniques.

BRIEF DESCRIPTION OF THE DRAWINGS

For the purposes of illustration and not of limitation, the present invention is described in greater detail below with reference to the following drawings, in which.

DETAILED DESCRIPTION OF PREFERRED EMBODIMENTS

Figure 1:
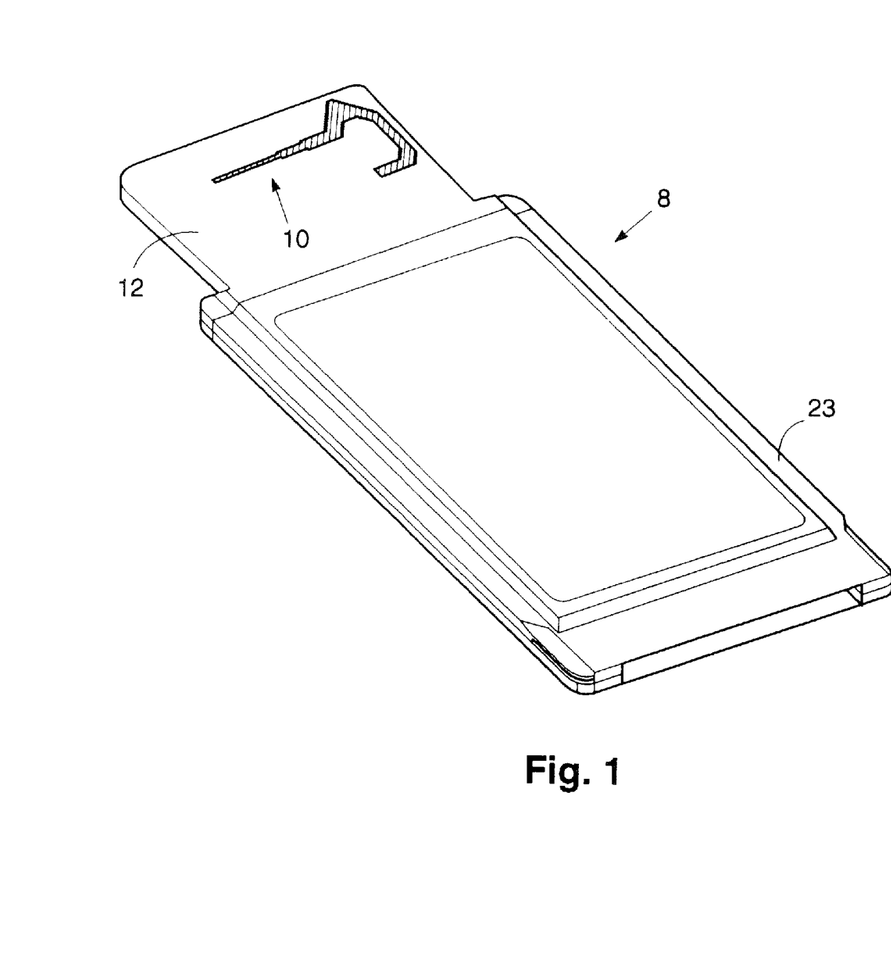
FIG. 1 is a perspective view of a peripheral computer card, including a cover, which incorporates the novel printed antenna according to a preferred embodiment of the invention.
Figure 3:
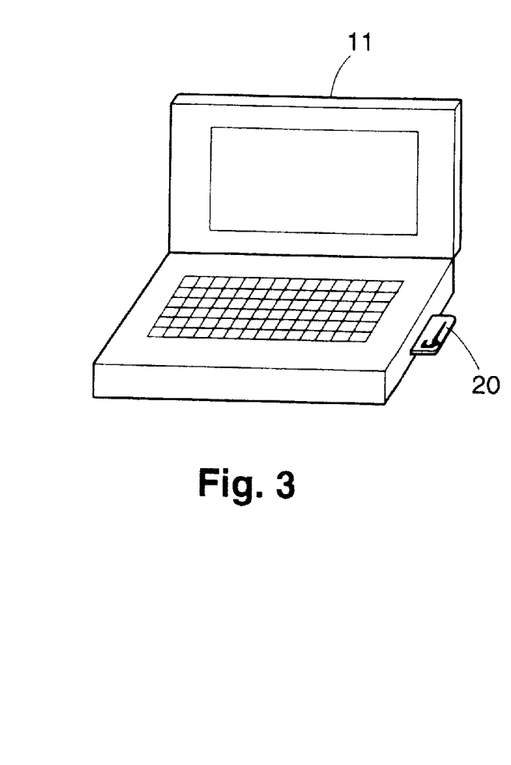
FIG. 3 is a perspective view of the peripheral card of FIG. 1 when inserted into a lap top computer.

FIG. 1 shows a PCMCIA peripheral card 8 which incorporates a printed antenna 10 in accordance with the preferred embodiment. The peripheral card 8 is designed to be inserted into a lap top computer 11, as shown in FIG. 3.

Figure 2:
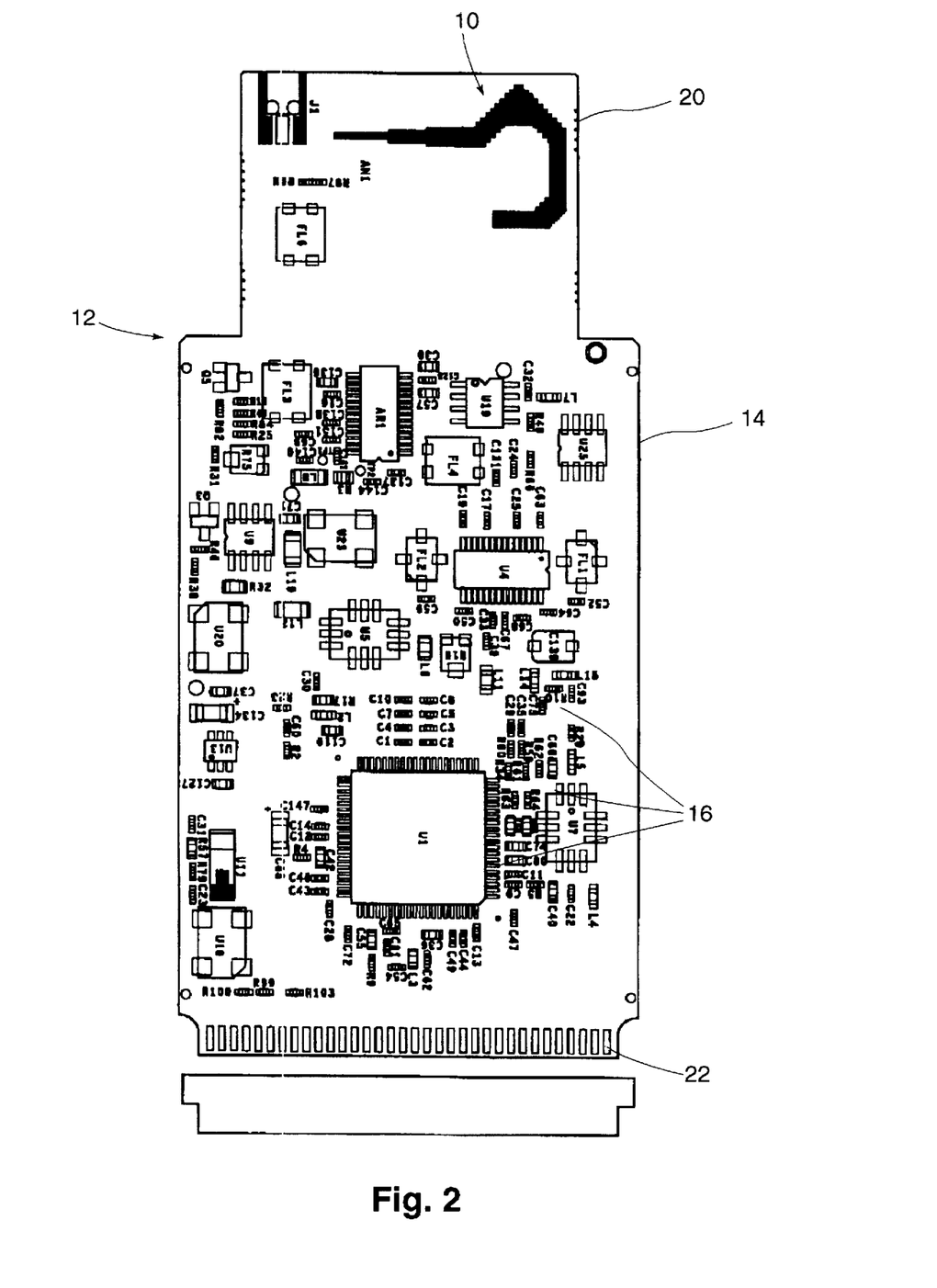
FIG. 2 is a detail view of the peripheral card shown in FIG. 1 with the cover removed.

As shown best in FIG. 2, the peripheral card 8 comprises a printed circuit board 12 which features two sections, a main section 14 and an extension section 20.

The main section 14 includes electronic circuitry 16 for driving the printed antenna 10, i.e. for applying and receiving radio frequency energy to and from printed antenna 10. The electronic circuitry is mounted on the main section 14 of the printed circuit board 12 in a known manner, such as by automated surface mount technology techniques. The main section 14 of the printed circuit board 12 also includes male card edge connector terminals 22 designed to fit into bifurcated female sockets (not shown) situated in a peripheral card slot of the lap top computer 11. As shown in FIG. 1, the main section 14 of the printed circuit board 12 is also intended to be encased in a metal case 23 which fits into the peripheral card slot in the laptop computer 11, as shown in FIG. 3.

The extension section 20 of the printed circuit board 12 contains the printed antenna 10. The extension section 20, however, is not intended to be encased by the metal case 23 or enclosed in or otherwise covered by the peripheral card slot. Rather, the extension section 20 is covered by a protective plastic layer (not shown) and is situated such that when the peripheral card 8 is inserted into the peripheral slot, the extension section 20 is exposed to the ambient environment in order to allow the printed antenna 10 to receive or radiate radio frequency energy, as shown in FIG. 3.

Figure 4:
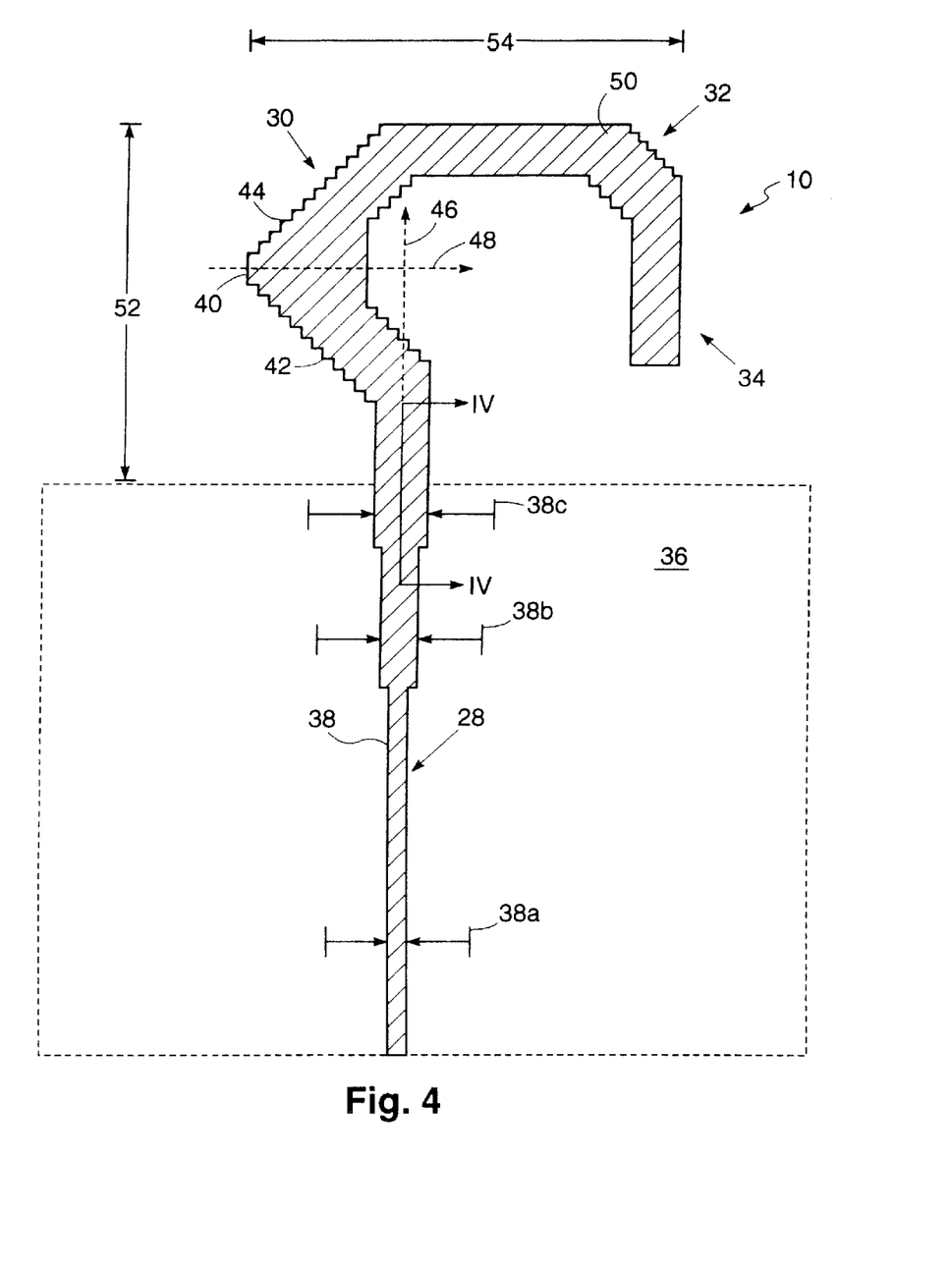
FIG. 4 is an isolated plan view of the printed antenna shown in FIG. 1.
Figure 5:
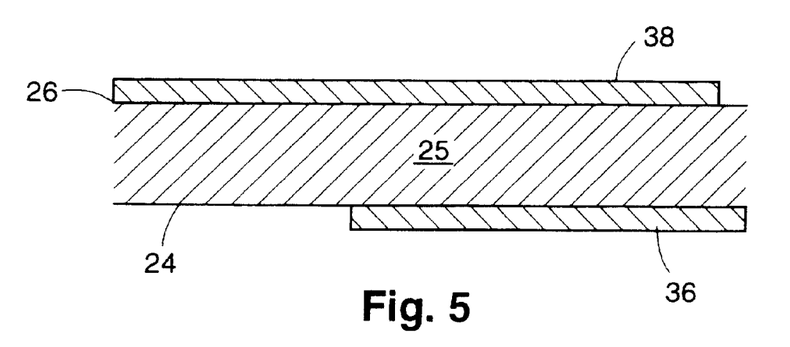
FIG. 5 is a magnified cross-sectional view of the printed antenna shown in FIG. 4 taken along line IV—IV therein.

Referring additionally to FIGS. 4 and 5, the printed antenna 10 is shown in greater detail. The preferred embodiment of the printed antenna 10 comprises five major components, namely (a) a thin, planar, dielectric material 25, (b) a microstrip electromagnetic transmission or feedline structure 28, (c) a main or primary radiating element 30, (d) a secondary radiating element 32; and (e) a tuning stub 34. These elements are discussed, in turn, below.

The thin, planar, dielectric material 25 is provided by the extension section 20 of the printed circuit board 1 2. The dielectric material 25, which includes opposed surfaces 24 and 26, provides a substrate for the printed antenna 10. In the preferred embodiment, the printed circuit board 12 is constructed out of "FR4 board", an epoxy-bonded fibreglass, having a nominal dielectric coefficient $\epsilon_r$ of about 4.4. The extension section 20 of printed circuit board 12 has a nominal board thickness of about 14 mils (millionths of an inch). However, actual dielectric coefficients and board thicknesses for printed circuit boards coming off of a high volume production line can vary by up to 20% or more due to manufacturing variances. Also, the dielectric constant tends to differ depending upon frequency, this characteristic being known to those skilled in this art as the "hook" effect.

The microstrip feedline structure 28 provides a transmission means for coupling radio frequency energy between the electrical circuitry 16 and the radiating portion of the printed antenna 10. (For greater certainty, the term "printed antenna" is intended to include all of the components (a) to (e) described above, whereas the terms "radiating element" or "radiating portion of antenna" excludes the feedline structure 28.) The microstrip feed line structure 28 also provides an impedance matching means for matching the driving impedance of electrical circuitry 16, which appears to be approximately 50 ohm to the radiating element, with the impedance of the radiating element, which is estimated to appear to be about 20 ohm or so to the electrical circuitry.

Structurally, the microstrip feedline structure 28 is a two-layered structure comprising a layer of an electrically conductive material 36, such as copper, disposed on dielectric surface 24, and a strip (i.e. a relatively narrow and elongate layer) of electrically conductive material 38, such as copper, disposed on the opposite dielectric surface 26. The electrically conductive layer 36 occupies about half of dielectric surface 24 and provides a ground plane. The electrically conductive strip 38 extends over the corresponding area defined by the ground plane layer 36, when viewed along a direction normal to the ground plane. The conductive strip 38, in conjunction with the ground plane layer 36, thus provides a microstrip transmission line. In the preferred embodiment, the conductive strip 38 has three discrete widths, denoted by dimensions 38a, 38b and 38c, along the length thereof. In this manner, the electrically conductive strip 38, in conjunction with the ground plane layer 36, provides a "double stubbed" feedline structure, as is known in the art, for matching the impedances of the electrical circuitry 16 and the radiating element.

The main radiating element 30 is composed of a second strip (i.e. a relatively narrow and elongate layer) of electrically conductive material 40, such as copper, which is disposed on dielectric surface 26 and is electrically connected to the feedline structure 28. In practice, conductive strip 40 is continuous with conductive strip 38, but is referred to herein as a "second" strip in order to define this portion of the printed antenna 10. Conductive strip 40, however, is disposed such that it does not extend over the ground plane layer 36, when viewed along a direction normal to the ground plane. The conductive strip 40 is preferably composed of two sequential, continuous, generally linear segments 42 and 44 which preferably have the same length and are angled with respect to one another, preferably at an angle of 90°. Thus, the main radiating element of the preferred embodiment of the printed antenna resembles a "V" in shape. The linear segments 42 and 44 are also preferably angled with respect to a longitudinal axis 46 of the feedline structure 28 such that a bisector axis 48 of the main radiating element lies transverse to the main feedline longitudinal axis 46. This geometry minimizes the longitudinal breadth 52 of the radiating element. In addition, the main radiating element 30 is stepped or boustrophedonically shaped at its periphery in order to enhance radiation therefrom as is known per se in the art.

The secondary radiating element 32 of the printed antenna is composed of a third strip of electrically conductive material 50, such as copper, which is electrically connected to the main radiating element 30 and in practice is continuous with conductive strip 40. Conductive strip 30 can be any shape, but in the interests of economising surface area, is bent to return towards the feedline structure 28. Thus, the overall appearance of the preferred embodiment of the printed antenna structure 10, including the feedline structure 28, resembles the shape of a hook or question mark ("?") composed of a sequentially connected series of substantially linear segments.

The tuning stub 34 is in essence a terminating portion of the third conductive strip 50. The printed antenna 10 can be adjusted to radiate within a given frequency band by adjusting the length of tuning stub 34. To achieve a carrier or center frequency $f_o$ having a centre wavelength $\lambda_o$, it has been found that the overall length of the radiating portion of the antenna (i.e., excluding the feedline structure 28) should be made approximately but not necessarily exactly, $\lambda_o/2$, where $\lambda_o$ is equal to $$\lambda_o = \frac{1}{\sqrt{\varepsilon_r}} * \frac{c}{f_o}, \quad c \text{ being the speed of light}$$

The fact that the overall length of the radiating portion of the antenna with a carrier frequency $f_o$ is not exactly equal to $\lambda_o/2$ may be thought or theorized by some skilled in the art to be due to the effect of fringing fields at the edges of the radiating antenna, but of course other physical phenomenon may account for this characteristic. Nevertheless, the precise frequency range of the antenna can be adjusted by the relatively minute shortening or lengthening of tuning stub 34. For example, the applicant has been able to attain a centre frequency of 2.437 GHz with a radiating element approximately 2.4 cm long using a printed circuit board having a nominal dielectric co-efficient of 4.4 and a nominal thickness of 14 mils. Such a frequency is typical of carrier frequencies in emerging wireless data communication standards.

The advantages and utility of the printed antenna 10 to solve a number of conflicting design constraints are now discussed in greater detail.

First, unlike microstrip patch antennas, the radiating portion of the printed antenna 10 is not disposed directly over a ground plane. Thus, compared to microstrip patch antennas, the tuned or center frequency of the printed antenna 10 will be relatively intolerant to variations in the dielectric constant of the printed circuit board.

Figure 6:
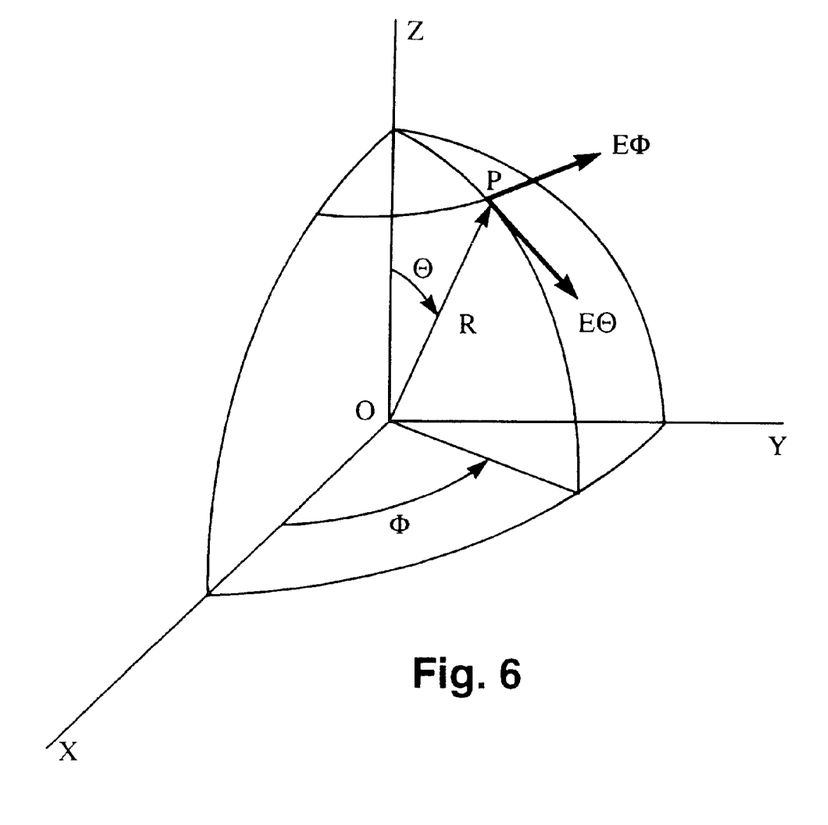
FIG. 6 is an illustration of a co-ordinate system useful for plotting radiation patterns associated with printed antenna structures.
Figure 7A:
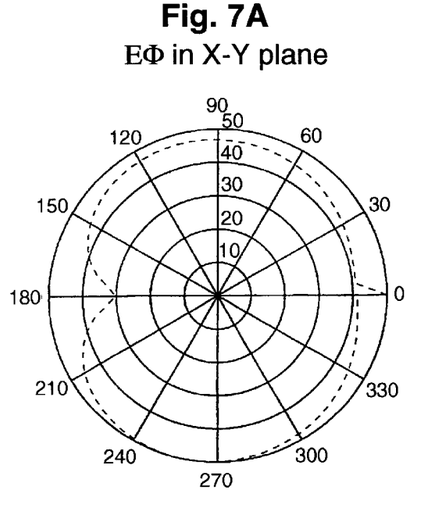
FIGS. 7A–7F are plots of computed radiation patterns of a mathematical model of a particular embodiment of the printed antenna shown in FIG. 1, having reference to the co-ordinate system shown in FIG. 5.
Figure 7B:
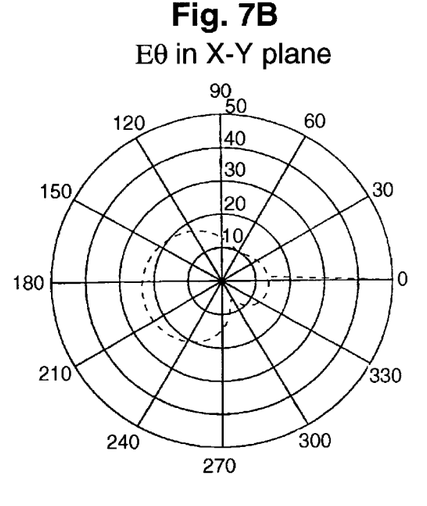
Figure 7C:
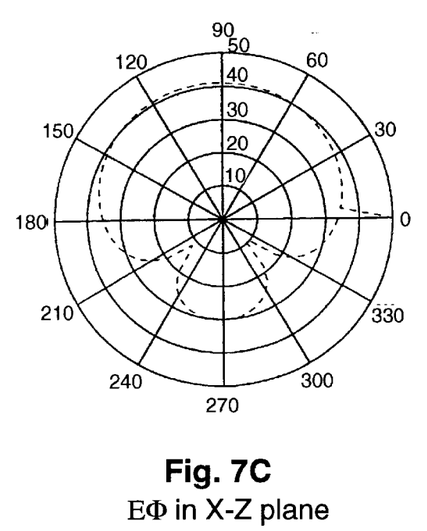
Figure 7D:
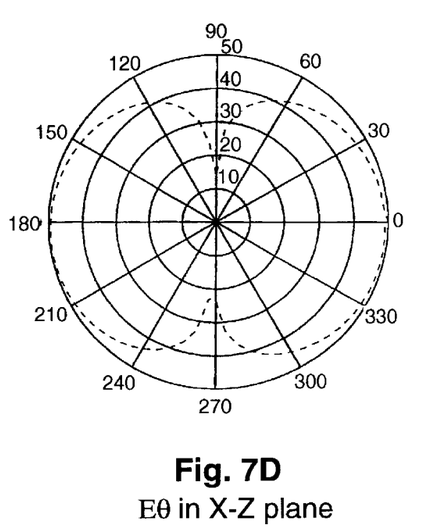
Figure 7E:
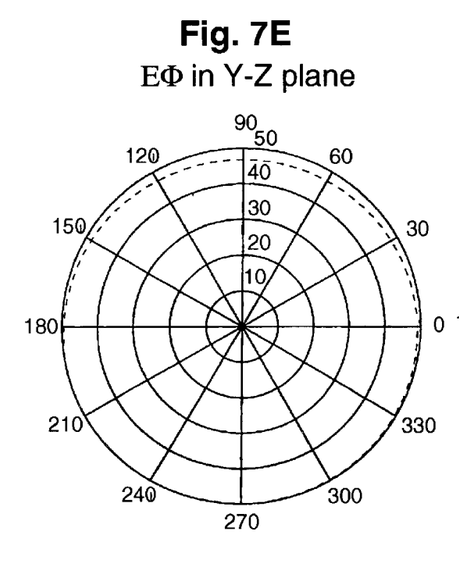
Figure 7F:
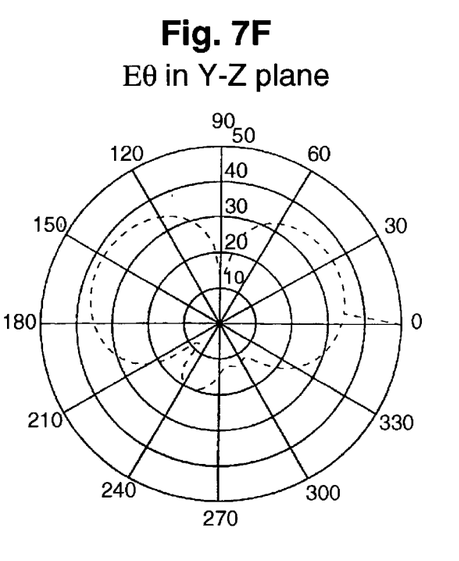

Second, because the radiating portion of the printed antenna 10 is not disposed over a ground plane, the printed antenna 10 can radiate in both upper and lower hemispheres with respect to the plane of the antenna. FIGS. 7A–7F are graphical plots of the electric field components $E_\theta$ and $E_\phi$ at a distance of 10 meters from the printed antenna 10 for an embodiment thereof having a radiating element approximately 2.5 cm long. (The plots were conducted with respect to an isolated antenna, i.e. not being inserted into the laptop computer. The computer, due to its three dimensional characteristics, will have some effect on the radiating characteristics of the printed antenna 10 at frequencies in the GHz range.) The reference co-ordinate system for these plots is shown in FIG. 6, the origin being situated substantially at the center of the printed antenna 10 with the x-axis lying along the longitudinal axis 46 of the feedline structure 28. The plots were generated by a commercially available simulator assuming a dielectric constant of 4.0 and a dielectric material thickness of 0.36 millimetres. It will be seen from these plots that the printed antenna 10 has an omnidirectional radiation pattern exhibiting good radiation dispersion characteristics.

It may be theorized by some skilled in the art that the radiation dispersion characteristics of the printed antenna 10 are due mainly to the shape of the main radiating element 30. As mentioned, the segments 40 and 42 of the main radiating element 30 are angled with respect to one another, and are preferably orthogonal to one another. Such a geometry permits the direction of induced currents in the segments 40 and 42 to be orthogonal to one another and hence enables the main radiating element to collect or couple energy over a wide region of space, as opposed to a strictly linear radiating element which cannot collect linearly polarized electromagnetic energy in which the electric field is orthogonal to the linear radiating element. Thus, the inclined segments 40 and 42 provide a wide dispersion radiation pattern for use in a multi-path environment where it is assumed that the probability of the incident angle of the electric field component of a received electromagnetic wave is substantially the same over any region of space. Such channel characteristics are common in many wireless data communication environments.

Figure 8:
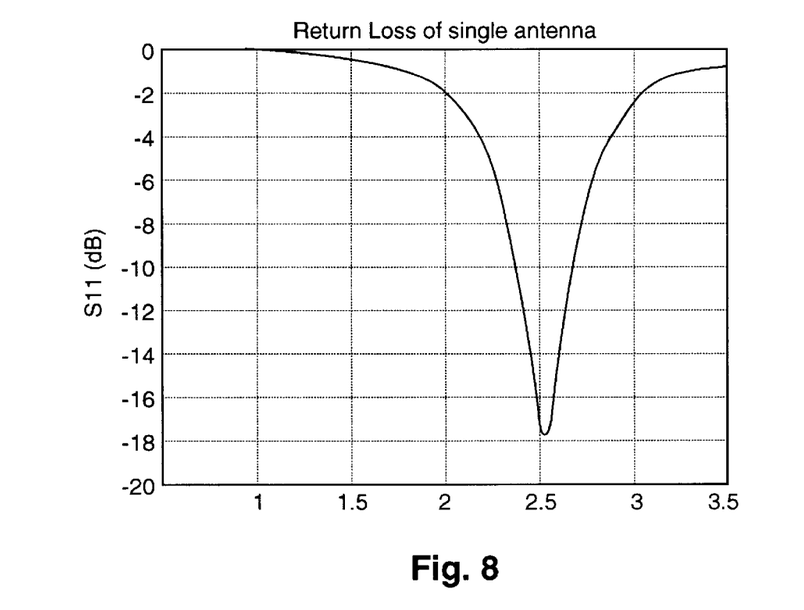
FIG. 8 is a plot of the return loss of the particular embodiment of the printed antenna whose computed radiation patterns are modelled in FIGS. 7A–7F.

Third, because the radiating portion of the printed antenna 10 is not situated over a ground plane, the antenna 10 does not present a highly resonant thin cavity structure. Instead, the printed antenna 10 presents a partially resonant structure as compared to the highly resonant nature of microstrip patch antennas. Therefore, the printed antenna 10 is relatively intolerant to variations in the thickness of the printed circuit board 12, which can be relatively substantial for printed circuit boards manufactured on high volume production lines. This means that the printed antenna 10 can provide a relatively wide bandwidth even when a very thin printed circuit board is used as is apt to occur in the latest generation of wireless data communication products. FIG. 7 shows a plot of the stimulated return loss of the particular embodiment of printed antenna 10 having a radiating element length of approximately 2.5 cm and a total length approximately 7 cm long, which, as shown, produces a center frequency of about 2.6 GHz. ((The plot was conducted with respect to an isolated antenna.) It will be seen that the predicted bandwidth for this particular embodiment, typically defined as the −10 dB return loss of the antenna, is about 150 MHz, or 6% of the center frequency.

Fourth, the longitudinal and latitudinal breadths of the radiating portions of printed antenna 10, respectively denoted by dimensions 52 and 54, are relatively small, each being only roughly $\lambda_o/6$ long, thereby occupying a relatively small surface area. In contrast, the longitudinal and latitudinal breadths of the radiating portions of a microstrip patch antenna are each about $\lambda_o/2$ long. The relatively small surface area required by printed antenna 10 is convenient for the design of small, portable, wireless data communications devices such as the PCMCIA peripheral card 8 for laptop computer 11.

While the preferred embodiment of the printed antenna has been described with a certain particularity for the purposes of illustration, it will be noted that various modifications may be made thereto while keeping within the spirit of the invention. For example, while the conductive material composing the radiating portion of printed antenna 10 has been shown to be located on dielectric surface 26, the conductive material may also be disposed on dielectric surface 24 provided there is no contact with the conductive ground layer 36. Also, while the various conductive segments comprising the printed antenna 10 have been illustrated as substantially straight lines, it should be appreciated that the segments may be somewhat arcuate at their peripheries provided that each segment remains generally linear from starting point to end point. As a further example, while the transmission means and impedance matching means have been shown to be the feedline structure 28, it will be appreciated that various other structures, such as a co-axial feedline, baluns, and quarter wave matching structures, can accomplish such functionality and are intended within the scope of such means. The scope of the invention is defined by the claims which follow.

I claim:

1. A printed antenna for transmission of a spectrum of electromagnetic waves having a center wavelength $\lambda_o$, the printed antenna comprising:
   a substantially planar dielectric material having two spaced apart and substantially parallel surfaces;
   a strip of electrically conductive material covering a portion of one of the surfaces of the dielectric material for providing a radiating element, the strip of electrically conductive material substantially not extending over any relatively large region of electrically conductive material disposed on the other surface of the dielectric material; and
   a feed line structure for coupling radio frequency energy between the radiating element of the antenna and antenna driving circuitry;
   wherein the strip of electrically conductive material has an overall length of approximately $\lambda_o/2$, and includes a first segment and a sequential second segment electrically connected thereto, the first segment being generally linear, the second segment being generally linear and disposed so as to be angled with respect to the first segment, and
   wherein the feed line structure features a longitudinal axis and the first and second segments of the radiating element collectively feature a bisector axis which lies substantially normal to the longitudinal axis.

2. The printed antenna according to claim 1, further including impedance means for matching the impedance of the antenna driving circuitry with the radiating element of the antenna.

3. The printed antenna according to claim 2, wherein the first and second segments of the radiating element are angled with respect to each other at an angle in the range of approximately 20° to 160°.

4. The printed antenna according to claim 3, wherein the the first and second segments of the radiating element are angled with respect to each other at an angle in the approximate range of 45° to 135°.

5. The printed antenna according to claim 4, wherein the first and second segments of the radiating element are substantially orthogonal to one another.

6. The printed antenna structure as claimed in claim 1, wherein the first and second segments of the radiating element are substantially the same length.

7. A printed antenna for transmission of a spectrum of electromagnetic waves having a center wavelength $\lambda_o$, the printed antenna comprising:
   a substantially planar dielectric material having two spaced apart and substantially parallel surfaces;
   a strip of electrically conductive material covering a portion of one of the surfaces of the dielectric material for providing a radiating element, the strip of electrically conductive material substantially not extending over any relatively large region of electrically conductive material disposed on the other surface of the dielectric material; and
   an antenna feedline for coupling radio frequency energy between the radiating element of the antenna and antenna driving circuitry;
   wherein the strip of electrically conductive material has an overall length of approximately $\lambda_o/2$, and includes a first segment and a sequential second segment electrically connected thereto, the first segment being generally linear, the second segment being generally linear and disposed so as to be angled with respect to the first segment at an angle in the range of approximately 20° to 160°;
   wherein a portion of the strip of electrically conductive material further comprises a plurality of additional segments electrically connected to the first and second segments thereof, the additional segments and the first and second segments being arranged such that the overall shape of the radiating element generally resembles a hook.

8. The printed antenna according to claim 7, wherein the first and second segments of the radiating element are substantially the same length and collectively compose at least one third of the overall length of the radiating element.

9. The printed antenna according to claim 8, wherein the radiating element has a longitudinal breadth of approximately $\lambda_o/6$ and a latitudinal breadth of approximately $\lambda_o/6$.

10. A printed antenna structure, comprising:
    a substantially planar dielectric material having two spaced apart and substantially parallel surfaces;

a first layer of electrically conductive material which covers a portion of one the surfaces of the dielectric material in order to provide an electrically conductive ground plane layer;

a first strip of electrically conductive material which covers a portion of the other surface of the dielectric material and is disposed so as to extend over the electrically conductive ground plane layer, the first electrically conductive strip providing a microstrip feed line structure for the antenna;

a second strip of electrically conductive material, electrically connected the first strip of conductive material, which covers a portion of one of the surfaces of the dielectric material and is disposed thereon so as not to extend over the electrically conductive ground plane layer, the second strip of electrically conductive material constituting a main radiating element of the antenna;

wherein the main radiating element includes a first segment and a second segment electrically connected thereto, the first segment being generally linear, the second segment being generally linear and disposed so as to be angled with respect to the first segment, and wherein the feed line structure features a longitudinal axis and the main radiating element features a bisector axis which lies substantially normal to the longitudinal axis.

11. The printed antenna structure according to claim 10, wherein the first and second segments of the main radiating element are approximately the same length and the first and second segments are angled with respect to each other at an angle in the range of approximately 30° to 150°.

12. A printed antenna structure, comprising:

a substantially planar dielectric material having two spaced apart and substantially parallel surfaces;

a first layer of electrically conductive material which covers a portion of one the surfaces of the dielectric material in order to provide an electrically conductive ground plane layer;

a first strip of electrically conductive material which covers a portion of the other surface of the dielectric material and is disposed so as to extend over the electrically conductive ground plane layer, the first electrically conductive strip providing a microstrip feed line structure for the antenna;

a second strip of electrically conductive material, electrically connected the first strip of conductive material, which covers a portion of one of the surfaces of the dielectric material and is disposed thereon so as not to extend over the electrically conductive ground plane layer, the second strip of electrically conductive material constituting a main radiating element of the antenna, wherein the main radiating element includes a first segment and a second segment electrically connected thereto, the first segment being generally linear, the second segment being generally linear and disposed so as to be angled with respect to the first segment; and a third strip of electrically conductive material for providing a secondary radiating element, the third strip having a fixed end continuous with the second strip of electrically conductive material and a free terminal end that does not connect with the second strip of electrically conductive material, the third strip being disposed so as not to substantially extend over the ground plane layer, the third strip including third and fourth generally linear segments which are electrically connected together and are angled with respect to one another.

13. The printed antenna structure according to claim 12, wherein the third and fourth segments of the third strip of electrically conductive material are angled with respect to each other at an angle in the range of approximately 30° to 150°.

14. The printed antenna structure according to claim 13, wherein the main radiating element has a bisector axis which is generally transverse to a longitudinal axis associated with the first strip of electrically conductive material.

15. The printed antenna structure according to claim 14, wherein the generally linear segments of the secondary radiating element are arranged so as to give the printed antenna structure an overall shape which generally resembles a hook.

16. The printed antenna structure according to claim 12, wherein the first strip of electrically conductive material has three distinct widths along the length thereof in order to provide a double-stubbed feedline structure for matching the impedance of the radiating elements of the antenna with the antenna driving circuitry.

* * * * *